(12) United States Patent
Tsuji

(10) Patent No.: US 8,486,809 B2
(45) Date of Patent: Jul. 16, 2013

(54) METHOD FOR FORMING LAMINATED RESIN FILM AND METHOD FOR PRODUCING SEMICONDUCTOR DEVICE

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 231 days.

(21) Appl. No.: 13/151,687

(22) Filed: Jun. 2, 2011

(65) Prior Publication Data
US 2011/0306185 A1    Dec. 15, 2011

(30) Foreign Application Priority Data

Jun. 9, 2010 (JP) .................................. 2010-132261

(51) Int. Cl.
*H01L 21/20* (2006.01)

(52) U.S. Cl.
USPC ......... 438/478; 438/32; 257/E21.09; 427/275

(58) Field of Classification Search
USPC ................ 438/32, 478; 257/E21.09; 427/275
See application file for complete search history.

(56) References Cited

U.S. PATENT DOCUMENTS

| 7,846,756 | B2* | 12/2010 | Yen et al. ..................... | 438/42 |
| 2002/0187579 | A1* | 12/2002 | Kubota ......................... | 438/43 |
| 2005/0069732 | A1* | 3/2005 | Kamata et al. ........... | 428/694 TC |
| 2010/0081224 | A1* | 4/2010 | Yanagisawa ................. | 438/32 |
| 2010/0197057 | A1* | 8/2010 | Tsuji ............................. | 438/32 |
| 2011/0241051 | A1* | 10/2011 | Carter et al. ................. | 257/98 |
| 2012/0058582 | A1* | 3/2012 | Tsuji ............................. | 438/32 |
| 2013/0005062 | A1* | 1/2013 | Yanagisawa ................. | 438/32 |

FOREIGN PATENT DOCUMENTS

JP       2008-300737       12/2008

OTHER PUBLICATIONS

M. Miller et al., "Fabrication of nanometer sized features on non-flat substrates using a nano-imprint lithography process", Proc. SPIE 5751 994, 2005.

* cited by examiner

*Primary Examiner* — Alexander Ghyka
*Assistant Examiner* — Stanetta Isaac
(74) *Attorney, Agent, or Firm* — Smith, Gambrell & Russell, LLP

(57) ABSTRACT

A method for producing a semiconductor device includes the steps of forming a semiconductor layer; forming a non-silicon-containing resin layer on the semiconductor layer; forming a pattern in the non-silicon-containing resin layer; forming a silicon-containing resin layer on the non-silicon-containing resin layer; etching the silicon-containing resin layer; selectively etching the non-silicon-containing resin layer; and etching the semiconductor layer. The step of forming the silicon-containing resin layer includes the steps of applying a silicon-containing resin solution with a first viscosity on a surface of the non-silicon-containing resin layer, the silicon-containing resin solution containing a silicon-containing resin and a volatile solvent; heating the silicon-containing resin layer to a first temperature, the silicon-containing resin layer having a second viscosity by heating to the first temperature, the second viscosity being larger than the first viscosity; and applying a rinse solution containing a volatile component to an edge portion of the silicon-containing resin layer.

10 Claims, 9 Drawing Sheets

US 8,486,809 B2

METHOD FOR FORMING LAMINATED RESIN FILM AND METHOD FOR PRODUCING SEMICONDUCTOR DEVICE

BACKGROUND OF THE INVENTION

1. Field of the Invention

The present invention relates to a method for forming a laminated resin film and a method for producing a semiconductor device.

2. Description of the Related Art

Patent Document 1 (Japanese Unexamined Patent Application Publication No. 2008-300737) describes a method for producing a semiconductor device including a diffraction grating. This method includes a step of forming a mask by drawing a pattern for the formation of the diffraction grating. In this step of forming a mask, sections of the pattern constituting a periodic structure are drawn such that the width of their ends in the longitudinal direction is larger than the width of their central portions in the longitudinal direction. As a result, the diffraction grating can be made to have a uniform depth in the entire structure.

SUMMARY OF THE INVENTION

A diffraction grating formed in a distributed feedback laser diode (DFB laser diode) has periodic projections and recesses having a period of about 200 nm. The height between the projections and recesses of such a diffraction grating is about 50 to 300 nm. In the production of semiconductor devices having such micropatterns, the micropatterns need to be formed with high accuracy and high reproducibility. Such a diffraction grating is formed by, for example, a two-beam interference exposure technique or an electron beam (EB) exposure technique. In such a technique, a diffraction-grating pattern is formed in a resist monolayer (resin layer) formed on a semiconductor layer. The semiconductor layer is then etched through the pattern in the resist monolayer serving as a mask to thereby transfer the pattern to the semiconductor layer.

Compound semiconductor substrates used for producing semiconductor devices do not have completely flat surfaces and the surfaces may have irregularities (surface roughness) of about 0.1 μm (100 nm). When a semiconductor layer formed on such a compound semiconductor substrate having irregularities is patterned through a resist monolayer so as to have a micropattern for a diffraction grating or the like, variation in the structure of the micropattern (for example, the width of sections of a diffraction-grating pattern) may occur due to irregularities of the substrate. To reduce such variation in the structure of a micropattern, a laminated resin film (bilayer resist) constituted by a non-silicon-containing resin layer (non-silicon-containing resist layer) and a silicon-containing resin layer (silicon-containing resist layer) can be employed.

A method for forming a diffraction grating will be described as an example of forming a micropattern by using such a laminated resin film (bilayer resist). A non-silicon-containing resin layer is formed on a semiconductor layer that is to be patterned so as to have a micropattern. At this time, the non-silicon-containing resin layer is formed so as to have a thickness sufficiently large to completely fill and cover irregularities in a surface of the semiconductor substrate. Thus, the non-silicon-containing resin layer covers the irregularities of the semiconductor substrate and has a flat surface. A diffraction-grating pattern (line-and-space pattern) is formed in the flat surface of the non-silicon-containing resin layer by a nano-imprint technique or the like. A silicon-containing resin layer is then formed on the non-silicon-containing resin layer having the diffraction-grating pattern so as to fill recesses of the diffraction-grating pattern.

The non-silicon-containing resin layer is then selectively etched through the silicon-containing resin layer formed in recesses of the diffraction-grating pattern and serving as a mask by a reactive ion etching method. As a result, a pattern in which projections and recesses are inverted with respect to the diffraction-grating pattern originally formed in the non-silicon-containing resin layer is formed. The semiconductor layer is etched through the patterned non-silicon-containing resin layer serving as a mask. The diffraction-grating pattern (inverted pattern) originally formed in the non-silicon-containing resin layer is accurately transferred to the semiconductor layer. In summary, by forming a micropattern with a bilayer resin film (serving as a mask) having a non-silicon-containing resin layer and a silicon-containing resin layer, variation in the structure of the micropattern due to irregularities in a surface of the semiconductor substrate can be reduced.

Such a non-silicon-containing resin layer is generally formed by applying a non-silicon-containing resin solution containing a non-silicon-containing resin (non-silicon-containing resist) and a solvent to a substrate by spin coating. Similarly, such a silicon-containing resin layer is generally formed by applying a silicon-containing resin solution containing a silicon-containing resin (silicon-containing resist) and a solvent to the non-silicon-containing resin layer by spin coating.

When such a solution is applied to a substrate by spin coating, a nonvolatile solvent is generally used as the solvent of the solution. When a nonvolatile solvent is used, the viscosity of the solution having been applied to the substrate by spin coating does not considerably change and hence the solution can be uniformly applied.

However, in the formation of a micropattern with a laminated resin film, since a silicon-containing resin layer is formed on a patterned non-silicon-containing resin layer, a volatile solvent is used as the solvent of the silicon-containing resin solution. This is because, when a nonvolatile solvent is used as the solvent of a silicon-containing resin solution, the solvent of the silicon-containing resin solution having been applied by spin coating does not evaporate and the solvent may dissolve the non-silicon-containing resin layer to change the structure of the pattern formed in the non-silicon-containing resin layer. When a volatile solvent is used as the solvent of a silicon-containing resin solution, the solvent of the silicon-containing resin solution having been applied by spin coating evaporates. Thus, change in the structure of the pattern formed in the non-silicon-containing resin layer due to the solvent can be suppressed.

However, a prominent portion of the layer is formed on the edge portion of the substrate, when a layer is formed by applying a solution to a substrate by spin coating. Such a prominent portion has a height of, for example, about 3 μm. The prominent portion may come off and become extraneous matter or may emit gas in subsequent steps. To avoid such problems, the layer is subjected to edge rinse after the application of a solution by spin coating.

Specifically, the edge rinse process is performed as follows. After a layer is formed by the application of a solution to a substrate by spin coating, a rinse solution is applied to a prominent portion on the edge portion (circumferential portion) of the substrate and the substrate is rotated to thereby remove the prominent portion. At this time, to effectively perform the edge rinse, the rinse solution preferably contains the same solvent as the applied solution. When such a rinse solution is applied to a prominent portion on the edge portion of the substrate, the prominent portion dissolves and becomes flowable. Thus, although a portion of dissolved matter of the prominent portion moves toward the center of the substrate from the original position of the prominent portion, the dissolved matter is basically removed from the substrate by a centrifugal force caused by the rotation of the substrate.

However, the edge rinse performed after the application of a silicon-containing resin solution by spin coating is performed with the solvent of the applied solution, that is, a volatile solvent. Thus, in the edge rinse, a portion of dissolved matter of the prominent portion having moved toward the center of the substrate may lose its flowability due to evaporation of the rinse solution before being removed from the substrate by a centrifugal force caused by the rotation of the substrate. In this case, another prominent portion of a silicon-containing resist layer is newly formed in a position relatively closer to the center of the substrate than the original prominent portion. That is, another prominent portion of a silicon-containing resist layer is newly formed in the edge portion of the edge-rinsed silicon-containing resist layer. This new prominent portion may have a height (for example, about 3 µm) equivalent to that of the original prominent portion.

The new prominent portion of a silicon-containing resist layer may come off and become extraneous matter or may emit gas in subsequent steps. In a subsequent step, the new prominent portion of a silicon-containing resist layer can be removed by a dry etching process; however, the dry etching process may damage the crystal of the semiconductor layer. Thus, it is difficult to produce semiconductor devices having a micropattern formed with a laminated resin film (bilayer resist) with a high yield.

A method for producing a semiconductor device according to an aspect of the present invention includes the steps of forming a semiconductor layer on a substrate; forming a non-silicon-containing resin layer on the semiconductor layer; forming a first pattern having a projection and a recess in the non-silicon-containing resin layer; forming a silicon-containing resin layer on the non-silicon-containing resin layer so as to cover the projection and the recess; etching the silicon-containing resin layer until a surface of the projection of the non-silicon-containing resin layer is exposed, the silicon-containing resin layer being left in the recess of the non-silicon-containing resin layer; selectively etching the non-silicon-containing resin layer through the silicon-containing resin layer left in the recess of the non-silicon-containing resin layer, the non-silicon-containing resin layer having a second pattern reverse to the first pattern; and etching the semiconductor layer through the non-silicon-containing resin layer having the second pattern. In addition, the step of forming the silicon-containing resin layer includes the steps of applying a silicon-containing resin solution with a first viscosity on a surface of the non-silicon-containing resin layer to provide the silicon-containing resin layer, the silicon-containing resin solution containing a silicon-containing resin and a volatile solvent; heating the silicon-containing resin layer to a first temperature, the silicon-containing resin layer having a second viscosity by heating to the first temperature, the second viscosity being larger than the first viscosity; and applying a rinse solution containing a volatile component to an edge portion of the silicon-containing resin layer.

By the above-described method for producing a semiconductor device, a semiconductor device having a micropattern can be produced with a laminated resin film including resin layers (laminated film including a non-silicon-containing resin layer and a silicon-containing resin layer).

In the above-described method for producing a semiconductor device, after the silicon-containing resin layer is provided by applying a silicon-containing resin solution containing a silicon-containing resin and a volatile solvent, heating the silicon-containing resin layer to a first temperature and applying a rinse solution containing a volatile component to an edge portion of the silicon-containing resin layer. The silicon-containing resin solution has a first viscosity. In the step of heating the silicon-containing resin layer to a first temperature, the viscosity of the silicon-containing resin layer increases and the silicon-containing resin layer has a second viscosity which is larger than the first viscosity. When the rinse solution is applied to the prominent portion of the silicon-containing resin layer (the prominent portion being formed on the edge portion of the substrate), a portion of dissolved matter of the prominent portion does not shift toward the center of the substrate from the original position of the prominent portion because of this increase in the viscosity.

As a result, the height of the prominent portion formed in the edge portion of the silicon-containing resin layer after the step of applying a rinse solution can be made smaller than a certain value.

In the above-described method for producing a semiconductor device, the rinse solution preferably contains the volatile solvent of the silicon-containing resin solution.

In the above-described method for producing a semiconductor device, after the step of applying a rinse solution containing a volatile component to an edge portion of the silicon-containing resin layer, the step of forming the silicon-containing resin layer further includes the step of heating the silicon-containing resin layer to a second temperature. The second temperature is higher than the first temperature. The silicon-containing resin layer may be hardened by heating to the second temperature. In this case, the viscosity of the silicon-containing resin layer is further increased and the silicon-containing resin layer is hardened. Hence another layer can be readily processed with this silicon-containing resin layer in a subsequent step.

In the above-described method for producing a semiconductor device, in the step of applying a silicon-containing resin solution, silicon-containing resin solution is applied by rotating the substrate at a first rotation speed. In the step of applying the rinse solution, the rinse solution is supplied by rotating the substrate at a second rotation speed. Furthermore, the second rotation speed is larger than the first rotation speed. In this case, the prominent portion is subjected to a sufficiently large centrifugal force in the step of applying the rinse solution and hence the height of the prominent portion of the silicon-containing resin layer may become smaller with more certainty.

In the above-described method for producing a semiconductor device, in the step of applying the silicon-containing resin solution, the silicon-containing resin solution preferably has a viscosity of 1.5 mPa·s or more and 2.0 mPa·s or less. In this case, the silicon-containing resin layer can be made to have a thickness such that another layer can be readily processed with this silicon-containing resin layer in a subsequent step.

In the above-described method for producing a semiconductor device, in the step of heating the silicon-containing resin layer to the first temperature, the silicon-containing resin layer preferably has a viscosity of 10 Pa·s or more and 1,000 Pa·s or less. When this viscosity is made 10 Pa·s or more, deformation of the silicon-containing resin layer due to a centrifugal force caused by the rotation of the substrate can be suppressed. When the viscosity is made 1,000 Pa·s or less, the prominent portion of the silicon-containing resin layer can be readily removed in the step of applying a rinse solution to the edge portion of the silicon-containing resin layer.

In the above-described method for producing a semiconductor device, the first pattern is a diffraction grating pattern having periodic projections and recesses.

The above-described method for producing a semiconductor device may further include the steps of forming an insulation layer on the semiconductor layer after the step of forming the semiconductor layer; and etching the insulation layer through the non-silicon-containing resin layer to form a patterned insulation layer after the step of selectively etching the non-silicon-containing resin layer. In addition, in the step of selectively etching the non-silicon-containing resin layer, the non-silicon-containing resin layer is etched until a portion of a surface of the insulation layer is exposed. In the step of etching the insulation layer, the insulation layer is etched until a portion of a surface of the semiconductor layer is exposed. And, in the step of etching the semiconductor layer, the semiconductor layer is etched through the patterned insulation layer. Since the insulation layer is formed on the semiconductor layer and the pattern is transferred to the insulation layer, the semiconductor layer can be etched through the patterned insulation layer serving as a mask. Since the insulation layer is formed on the semiconductor layer, contamination of the surface of the semiconductor layer can be suppressed during the formation of a micropattern with the laminated resin film. In addition, the surface of the semiconductor layer can be protected from damage caused by reactive ion etching.

A method for forming a laminated resin film according to another aspect of the present invention includes the steps of forming a non-silicon-containing resin layer on a main surface of a substrate; forming a pattern in the non-silicon-containing resin layer; and forming a silicon-containing resin layer on the non-silicon-containing resin layer having the pattern. In addition, the step of forming the silicon-containing resin layer includes the steps of applying a resin solution with a first viscosity on a surface of the non-silicon-containing resin layer to provide the silicon-containing resin layer, the resin solution containing a silicon-containing resin and a volatile solvent; heating the silicon-containing resin layer to a first temperature, the silicon-containing resin layer having a second viscosity by heating to the first temperature, the second viscosity being larger than the first viscosity; applying a rinse solution containing a volatile component to an edge portion of the silicon-containing resin layer, and heating the silicon-containing resin layer to a second temperature, the second temperature being higher than the first temperature, the silicon-containing resin layer being hardened by heating to the second temperature. Furthermore, in the step of heating the silicon-containing resin layer to the first temperature, the silicon-containing resin layer has a viscosity of 10 Pa·s or more and 1,000 Pa·s or less.

In the above-described method for forming a laminated resin film, after the silicon-containing resin layer is provided by applying a resin solution containing the silicon-containing resin and a volatile solvent, the steps of heating the silicon-containing resin layer to a first temperature, applying a rinse solution to an edge portion of the silicon-containing resin layer, and heating the silicon-containing resin layer to a second temperature are performed. The resin solution has a first viscosity. In the step of heating the silicon-containing resin layer to the first temperature, the viscosity of the silicon-containing resin layer increases and the silicon-containing resin layer has a second viscosity which is larger than the first viscosity. When the rinse solution is applied to the prominent portion of the silicon-containing resin layer (the prominent portion being formed on the edge portion of the substrate), a portion of dissolved matter of the prominent portion does not shift toward the center of the substrate from the original position of the prominent portion because of this increase in the viscosity.

As a result, the height of the prominent portion of the silicon-containing resin layer can be made smaller than a certain value. Furthermore, in the step of heating the silicon-containing resin layer to the second temperature, the viscosity of the silicon-containing resin layer is further increased and the silicon-containing resin layer is hardened by heating.

DESCRIPTION OF THE PREFERRED EMBODIMENTS

Figure 1A:
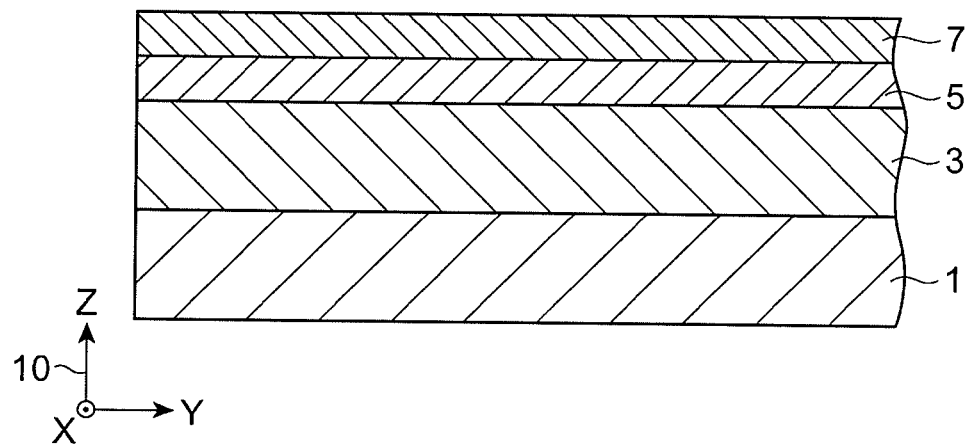
FIGS. 1A and 1B are schematic sectional views illustrating a method for producing a distributed feedback laser diode according to an embodiment.

Hereinafter, a method for forming a laminated resin film and a method for producing a semiconductor device according to embodiments will be described in detail with reference to the attached drawings. Like reference numerals are used to designate the same elements throughout the drawings. To make the drawings more readily understandable, dimensional proportions within elements and between elements are not necessarily based on the actual dimensional proportions.

A method for producing a semiconductor device according to an embodiment employs a method for forming a laminated resin film according to an embodiment. As a method for producing a semiconductor device according to an embodiment, a method for producing a distributed feedback laser diode including a diffraction grating will be described. FIGS. 1A to 9C are schematic sectional views illustrating a method for producing a distributed feedback laser diode (DFB laser diode) according to an embodiment. An orthogonal coordinate system 10 is illustrated in FIGS. 1A to 9C. A diffraction grating formed in a DFB laser diode has a micropattern including periodic projections and recesses. The period of the diffraction grating is about 200 nm and the height between projections and recesses is about 50 to 300 nm.

Step of Forming Semiconductor Layer

Referring to FIG. 1A, a lower cladding layer 3, an active layer 5, and a diffraction-grating layer 7 are epitaxially grown in this order on a main surface of a semiconductor substrate 1 by, for example, a metal-organic vapor phase epitaxy method. In FIG. 1A, X and Y axes are defined in directions parallel to the main surfaces of the semiconductor substrate 1.

The semiconductor substrate 1 is, for example, a disc-shaped semiconductor substrate having a diameter of 2 to 6 inches (5.08 to 15.24 cm). The semiconductor substrate 1 is a group III-V compound semiconductor substrate having a first conductivity. For example, the semiconductor substrate 1 is an n-type InP substrate doped with Sn (tin). The lower cladding layer 3 is a group III-V compound semiconductor layer having the first conductivity, for example, an n-type InP layer doped with Si. The active layer 5 has, for example, a multi quantum well (MQW) structure or a single quantum well (SQW) structure. The active layer 5 is composed of, for example, a group III-V compound semiconductor such as GaInAsP or AlGaInAs. The diffraction-grating layer 7 is a group III-V compound semiconductor layer having a second conductivity in which a diffraction grating 7g is to be formed (refer to FIG. 6B). The diffraction-grating layer 7 is, for example, a p-type GaInAsP layer doped with Zn.

Step of Forming Insulation Layer

Figure 1B:
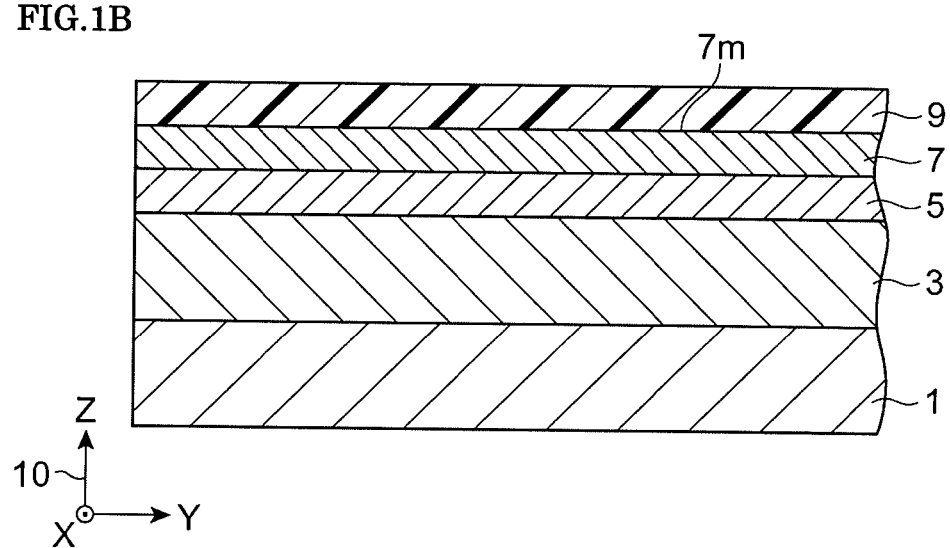

Referring to FIG. 1B, an insulation layer 9 is then formed on a surface 7m of the diffraction-grating layer 7 by, for example, plasma chemical vapor deposition (plasma CVD). The insulation layer 9 has a thickness of, for example, 20 to 50 nm. Examples of a material for forming the insulation layer 9 include silicon oxides such as $SiO_2$, silicon nitrides such as SiN, and silicon oxynitrides such as SiON.

Step of Forming Non-Silicon-Containing Resin Layer

Figure 2A:
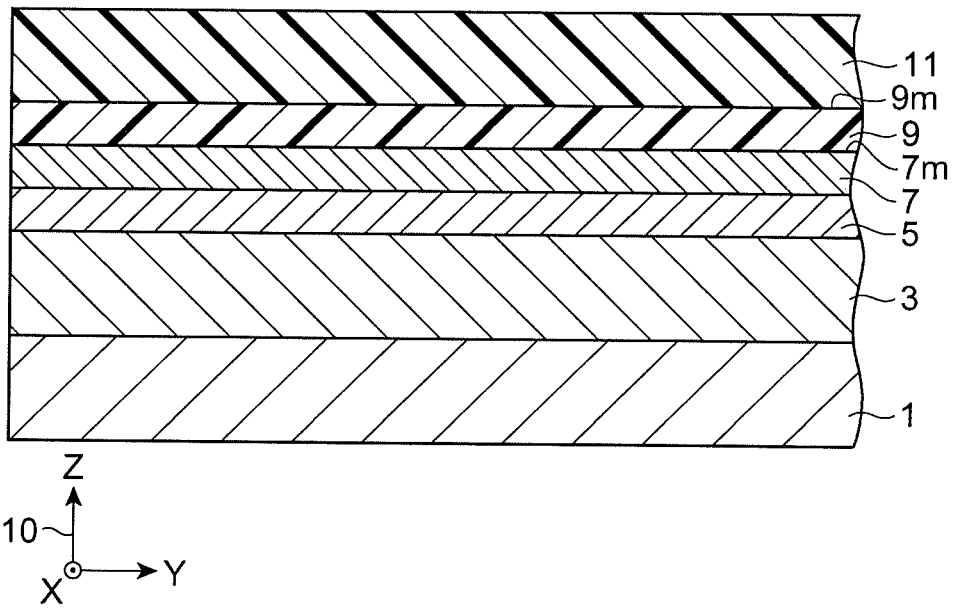
FIGS. 2A and 2B are schematic sectional views illustrating a method for producing a distributed feedback laser diode according to an embodiment.

Referring to FIG. 2A, a non-silicon-containing resin layer 11 is subsequently formed on a surface 9m of the insulation layer 9. The non-silicon-containing resin layer 11 is composed of a resin that substantially contains no silicon. The non-silicon-containing resin layer 11 is formed by, for example, dropping a non-silicon-containing resin solution containing a non-silicon-containing resin and a nonvolatile solvent onto the surface 9m of the insulation layer 9 and then rotating the substrate. Thus, the non-silicon-containing resin layer 11 that has a small and uniform thickness can be obtained. Examples of such a non-silicon-containing resin in a non-silicon-containing resin solution include ultraviolet (UV) curing resins such as UV-curing acrylic resins. Examples of such a nonvolatile solvent in a non-silicon-containing resin solution include 100% propylene glycol monomethyl ether acetate (PGMEA) and a propyleneglycol monomethylether (PM) thinner (manufactured by TOKYO OHKA KOGYO CO., LTD.). The term "non-silicon-containing" means that no silicon is substantially contained. When the non-silicon-containing resin layer 11 and a non-silicon-containing resin have a silicon content of 0.1 atom % or less, the non-silicon-containing resin layer 11 and the non-silicon-containing resin can be regarded as substantially containing no silicon.

When the non-silicon-containing resin layer 11 is formed by a spin coating method, if necessary, the non-silicon-containing resin layer 11 is subjected to edge rinse. If necessary, the non-silicon-containing resin layer 11 is subjected to a heat treatment so as to have a higher viscosity.

The non-silicon-containing resin layer 11 is preferably made to have a thickness sufficiently large to completely fill and cover irregularities in the surface 9m of the insulation layer 9 due to irregularities in a main surface of the semiconductor substrate 1, that is, a thickness equal to or more than the root-mean-square (RMS) roughness of the surface 9m of the insulation layer 9. In general, the RMS roughness of the surface 9m of the insulation layer 9 due to irregularities in a main surface of the semiconductor substrate 1 is substantially equivalent to the RMS roughness of the irregularities in the main surface of the semiconductor substrate 1 and is, for example, about 0.3 µm.

The upper limit of the thickness of the non-silicon-containing resin layer 11 may be, for example, about 1 µm. The pattern width (refer to FIG. 2B) for forming the diffraction grating 7g (refer to FIG. 6B) is very small: about 100 nm. When the non-silicon-containing resin layer 11 has a thickness of 1 µm or more, it is difficult to sufficiently provide an etching gas into etching grooves in the non-silicon-containing resin layer 11 in the "step of etching non-silicon-containing resin layer" described below. Thus, the non-silicon-containing resin layer 11 is preferably made to have a thickness of 1 µm or less (see FIG. 5A). In this case, an etching-depth distribution in the non-silicon-containing resin layer 11 in a plane parallel to a main surface of the semiconductor substrate 1 can be sufficiently made uniform. Accordingly, the non-silicon-containing resin layer 11 are uniformly etched and a surface of the insulation layer 9 is completely exposed. As a result, when the non-silicon-containing resin layer 11 has a thickness of 1 µm or less, an etching-depth distribution in the insulation layer 9 in a plane parallel to a main surface of the semiconductor substrate 1 can also be made uniform in the subsequent "step of etching insulation layer".

To enhance adhesion between the insulation layer 9 and the non-silicon-containing resin layer 11, an adhesion layer may be formed between the insulation layer 9 and the non-silicon-containing resin layer 11. Such an adhesion layer may be formed of, for example, a novolac resin. Such an adhesion layer may have a thickness of, for example, 50 nm or more and 80 nm or less.

Step of Forming Pattern in Non-Silicon-Containing Resin Layer

Figure 2B:
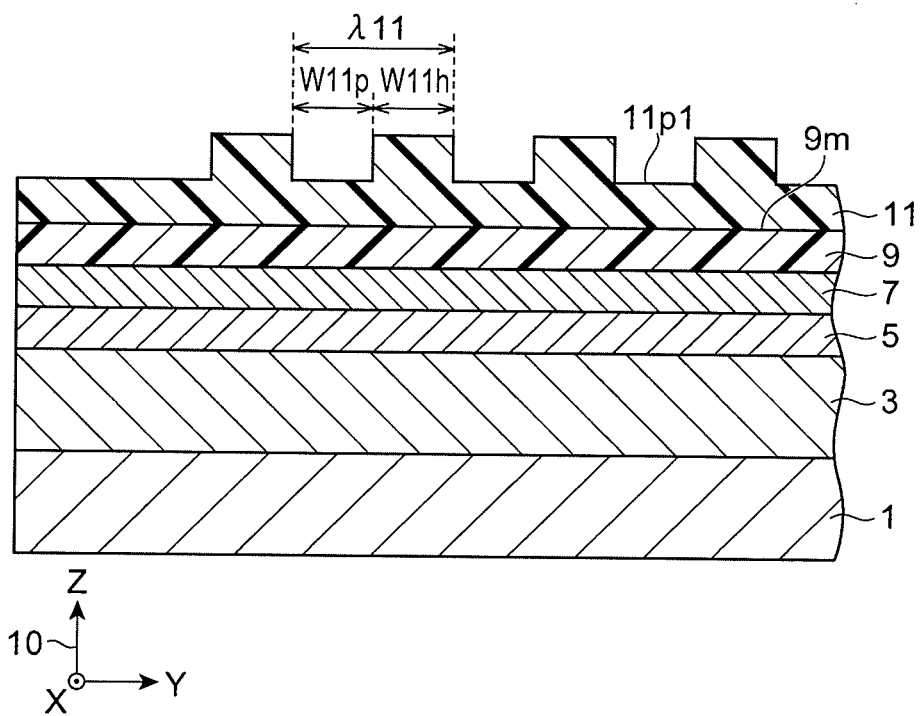

Referring to FIG. 2B, the non-silicon-containing resin layer 11 is then patterned to thereby form a periodic structure pattern 11p1 (corresponding to the periodic structure of the diffraction grating 7g to be formed in a subsequent step (refer to FIG. 6B)) in the surface of the non-silicon-containing resin layer 11. The periodic structure pattern 11p1 is a first pattern for this embodiment. The non-silicon-containing resin layer 11 may be patterned by, for example, a photolithography method or a nanoimprint lithography method. The periodic structure pattern 11p1 in the embodiment is a line-and-space pattern for forming the diffraction grating 7g in the diffraction-grating layer 7.

This line-and-space pattern is constituted by line sections extending along X axis and space sections extending along X axis. The line sections and the space sections are alternately periodically disposed along Y axis. A width W11h of the line sections in the Y-axis direction is substantially equal to a width W7h of recesses of the diffraction grating 7g to be formed (refer to FIG. 6B) and is, for example, 100 to 120 nm. Similarly, a width W11p of the space sections in the Y-axis direction is substantially equal to a width W7p of projections of the diffraction grating 7g to be formed (refer to FIG. 6B) and is, for example, 100 to 120 nm. A period λ11 of the line-and-space pattern is substantially equal to a period λ7 of the diffraction grating 7g to be formed (refer to FIG. 6B).

Step of Forming Silicon-Containing Resin Layer

A silicon-containing resin layer 13 is then formed on the non-silicon-containing resin layer 11. In the "step of forming silicon-containing resin layer" according to the embodiment, steps of applying a silicon-containing resin solution, heating the silicon-containing resin layer to a first temperature, applying a rinse solution containing a volatile component to an edge portion of the silicon-containing resin layer, and heating the silicon-containing resin layer to a second temperature are performed.

Step of Applying Silicon-Containing Resin Solution

Figure 3A:
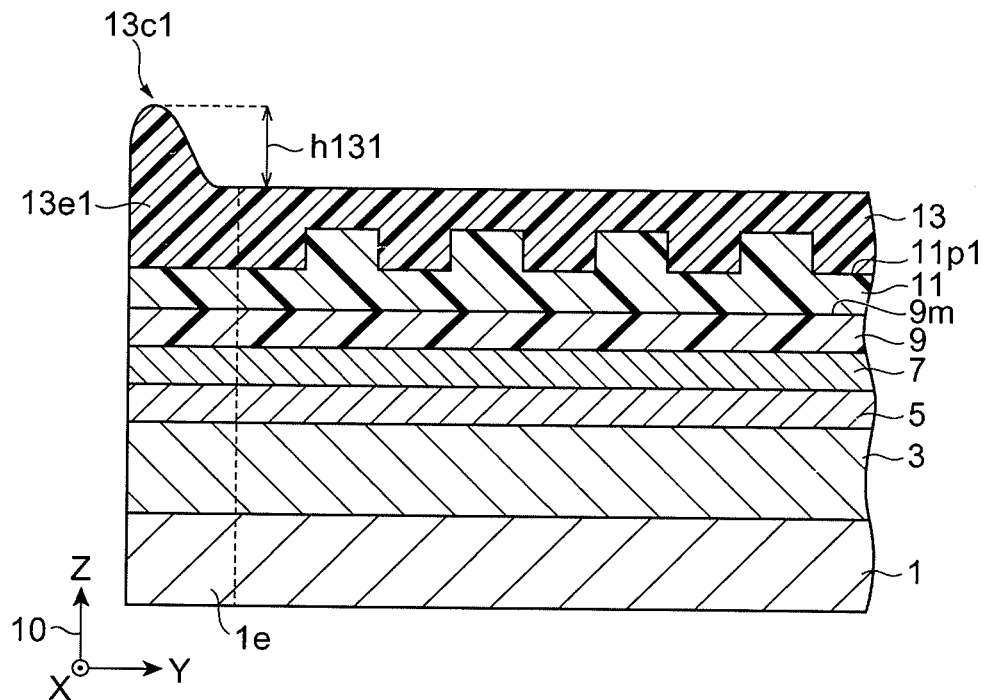
FIGS. 3A and 3B are schematic sectional views illustrating a method for producing a distributed feedback laser diode according to an embodiment.

Referring to FIG. 3A, in the step of applying a silicon-containing resin solution, a silicon-containing resin solution containing a silicon-containing resin and a volatile solvent is applied on a surface of the non-silicon-containing resin layer 11 by spin coating. Specifically, while the semiconductor substrate 1 is rotated, a silicon-containing resin solution is applied on a surface of the non-silicon-containing resin layer 11. At least a portion of the volatile solvent of the applied silicon-containing resin solution evaporates and the silicon-containing resin layer 13 is formed. The rotation axis about which the semiconductor substrate 1 is rotated is substantially orthogonal to a main surface of the semiconductor substrate 1 and substantially extends through the center of this main surface (the same rotation axis is also used in spin coating performed in subsequent steps). When a silicon-containing resin solution is applied by spin coating, the semiconductor substrate 1 may be rotated at the first rotation speed for 20 seconds. The first rotation speed is, for example, 1,500 revolutions per minute (rpm).

Examples of such a silicon-containing resin in the silicon-containing resin solution include organic silicon compounds such as silicon-bonded epoxy resins. An example of such a volatile solvent in the silicon-containing resin solution is a mixture (for example, an OK 73 thinner manufactured by TOKYO OHKA KOGYO CO., LTD.) containing 70% of propylene glycol monomethyl ether (PGME) and 30% of propylene glycol monomethyl ether acetate (PGMEA).

The thus-formed silicon-containing resin layer 13 has a prominent portion 13c1 on an edge portion (circumferential portion) 1e of the semiconductor substrate 1. That is, the prominent portion 13c1 is formed in an edge portion 13e1 of the silicon-containing resin layer 13 and is the highest in the silicon-containing resin layer 13. The edge portion 1e is a region, for example, within 1 mm from the rim of the semiconductor substrate 1.

A height h131 of the prominent portion 13c1 mainly depends on the viscosity of a silicon-containing resin solution to be applied by spill coating and the first rotation speed during applying the silicon-containing resin solution by spin coating. The height h131 is typically about 3 µm. The silicon-containing resin solution preferably has a viscosity of 1.5 mPa·s or more and 2.0 mPa·s or less. The viscosity of the silicon-containing resin solution is a first viscosity in the embodiment. In this case, the silicon-containing resin layer 13 can be made to have a thickness such that another layer can be readily processed with the silicon-containing resin layer 13 in a subsequent step. Specifically, when the silicon-containing resin solution has a viscosity of, for example, 1.5 mPa·s or more, the silicon-containing resin layer 13 can be made to have a thickness of about 200 nm or more. When the silicon-containing resin solution has a viscosity of, for example, 2.0 mPa·s or less, the silicon-containing resin layer 13 can be made to have a thickness of 300 nm or less. The viscosity of a silicon-containing resin solution can be measured according to, for example, the viscosity measurement method of JIS Z8803.

Step of Heating Silicon-Containing Resin Layer to First Temperature

The silicon-containing resin layer 13 is then heated to a first temperature with a heating unit to thereby increase the viscosity of the silicon-containing resin layer 13. By heating the silicon-containing resin layer 13 to the first temperature, a volatile solvent remaining in the silicon-containing resin layer 13 evaporates and/or the resin in the silicon-containing resin layer 13 alters and, as a result, the viscosity of the silicon-containing resin layer 13 increases. The heating unit may be a heater such as a hot plate. The first temperature may be, for example, 100° C. or more and 160° C. or less. The time for which the silicon-containing resin layer 13 is heated with a heating unit is, for example, 30 seconds or more and 120 seconds or less. The viscosity of the silicon-containing resin layer 13 can be measured according to, for example, the viscosity measurement method of JIS Z8803.

The silicon-containing resin layer 13 after heating to the first temperature has a higher viscosity than that of the silicon-containing resin layer 13 before heating (that is, the first viscosity); however, is still flowable. The viscosity of silicon-containing resin layer 13 after heating to the first temperature is a second viscosity in the embodiment. The silicon-containing resin layer 13 preferably has a viscosity of 10 Pa·s or more and 1,000 Pa·s or less by heating the silicon-containing resin layer to the first temperature. When the silicon-containing resin layer 13 has a viscosity of 10 Pa·s or more, the silicon-containing resin layer 13 has a sufficiently high viscosity in the step of applying a rinse solution containing a volatile component to an edge portion of the silicon-containing resin layer described below. Therefore, deformation of the silicon-containing resin layer 13 due to a centrifugal force caused by the rotation of the semiconductor substrate 1 can be suppressed. When the silicon-containing resin layer 13 has a viscosity of 1,000 Pa·s or less, the prominent portion 13c1 of the silicon-containing resin layer 13 sufficiently dissolves in a rinse solution in the step of applying a rinse solution to an edge portion of the silicon-containing resin layer described below. Therefore, the prominent portion 13c1 can be readily removed.

Step of Applying Rinse Solution Containing Volatile Component to Edge Portion of Silicon-Containing Resin Layer (Edge-Rinse Step)

Figure 3B:
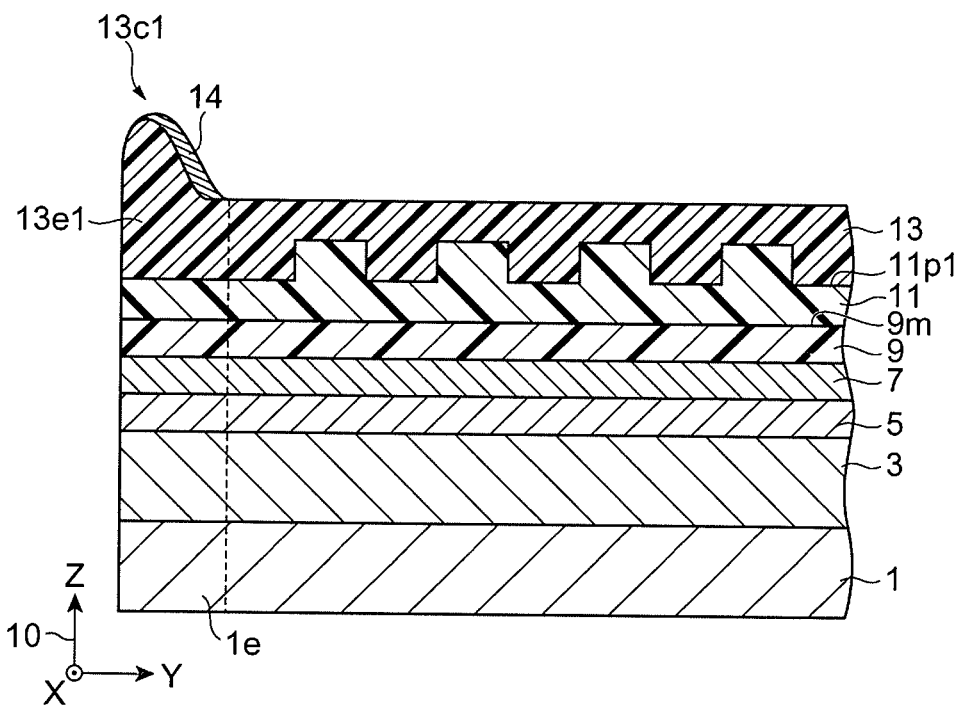

The silicon-containing resin layer 13 is then subjected to edge rinse. Referring to FIG. 3B, in the step of applying a rinse solution containing a volatile component to an edge portion of the silicon-containing resin layer, a rinse solution 14 containing a volatile component is applied by spin coating to the edge portion 13e1 of the silicon-containing resin layer 13, that is, the prominent portion 13c1. As a result, the prominent portion 13c1 of the silicon-containing resin layer 13 dissolves in the rinse solution 14. A portion of dissolved matter of the prominent portion 13c1 is removed from the semiconductor substrate 1 by a centrifugal force caused by the rotation of the semiconductor substrate 1. Another portion of the dissolved matter of the prominent portion 13c1 moves toward the center of the semiconductor substrate 1 (in the positive Y-axis direction) from the position of the prominent portion 13c1 (refer to FIG. 3B) to become a new prominent portion 13c2 due to evaporation of the volatile solvent. Since the viscosity of the silicon-containing resin layer 13 is increased in the step of heating the silicon-containing resin layer to the first temperature, the proportion of the dissolved matter of the prominent portion 13c1 moving toward the center of the semiconductor substrate 1 is small. The edge portion 13e1 is a region, for example, within 1 mm from the rim of the silicon-containing resin layer 13.

In the step of applying a rinse solution, the rotation speed of the semiconductor substrate 1 during applying the rinse solution 14 by spill coating (that is, a second rotation speed) is preferably larger than the first rotation speed in the step of applying a silicon-containing resin solution. In this case, the prominent portion 13c1 is subjected to a sufficiently large centrifugal force in the step of applying a rinse solution to the edge portion of the silicon-containing resin layer. Therefore, the edge rinse for the silicon-containing resin layer 13 can be performed with more certainty. In the step of applying a rinse solution, the semiconductor substrate 1 may be rotated at a rotation speed of, for example, 5,000 rpm (revolutions per minute) for 60 seconds during applying the rinse solution 14 by spin coating.

Figure 4A:
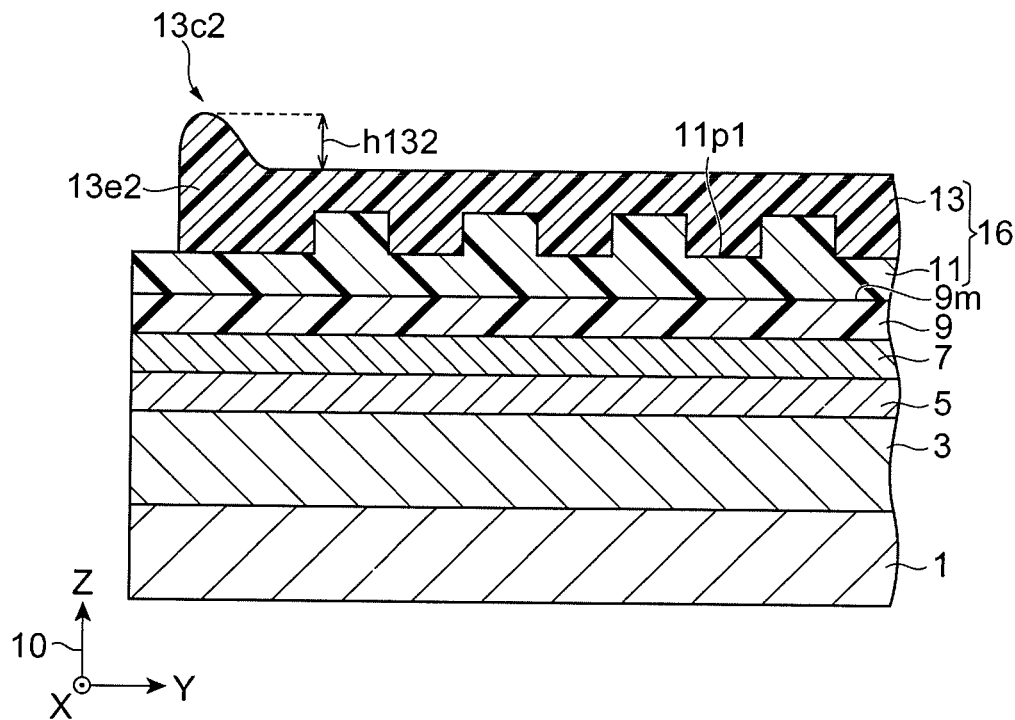
FIGS. 4A and 4B are schematic sectional views illustrating a method for producing a distributed feedback laser diode according to an embodiment.

Referring to FIG. 4A, as a result of the step of applying a rinse solution, at least a portion of the edge portion 13e1 of the silicon-containing resin layer 13 is removed and the new prominent portion 13c2 is formed in a new edge portion 13e2 of the silicon-containing resin layer 13. A height h132 of the new prominent portion 13c2 is smaller than the height h131 of the prominent portion 13c1 (refer to FIG. 3A). The height h132 is typically about 100 nm. The edge portion 13e2 is a region, for example, within 2 mm from the rim of the silicon-containing resin layer 13.

The rinse solution 14 used in the step of applying a rinse solution preferably contains, as the volatile component, a volatile solvent in the silicon-containing resin solution used for forming the silicon-containing resin layer 13 in the step of applying a silicon-containing resin solution, for example, a mixture containing 70% of propylene glycol monomethyl ether (PGME) and 30% of propylene glycol monomethyl ether acetate (PGMEA). In this case, the edge rinse for the silicon-containing resin layer 13 in the step of applying a rinse solution can be performed with more certainty.

Step of Heating Silicon-Containing Resin Layer to Second Temperature

The silicon-containing resin layer 13 is subsequently heated to a second temperature with a heating unit. The second temperature is higher than the first temperature. As a result, the viscosity of the silicon-containing resin layer 13 is further increased. By heating the silicon-containing resin layer 13 to the second temperature, a volatile solvent remaining in the silicon-containing resin layer 13 evaporates and/or the resin in the silicon-containing resin layer 13 alters and, as a result, the viscosity of the silicon-containing resin layer 13 increases. The viscosity of the silicon-containing resin layer 13 can be measured according to, for example, the viscosity measurement method of JIS Z8803.

The heating unit may be a heater such as a hot plate. The second temperature may be, for example, 180° C. or more and 200° C. or less. The time for which the silicon-containing resin layer 13 is heated with a heating unit is, for example, 30 seconds or more and 120 seconds or less. As a result, the silicon-containing resin layer 13 is hardened by heating to the second temperature.

Since the viscosity of the silicon-containing resin layer 13 is further increased by heating the silicon-containing resin layer to the second temperature, other layers can be readily processed with the silicon-containing resin layer 13 in subsequent steps. However, when the silicon-containing resin layer 13 after the step of applying a rinse solution has a sufficiently high viscosity, the step of heating the silicon-containing resin layer to a second temperature may be eliminated.

As a result of the above-described steps, a laminated resin film 16 constituted by the non-silicon-containing resin layer 11 and the silicon-containing resin layer 13 is formed.

Step of Etching Silicon-Containing Resin Layer

Figure 4B:
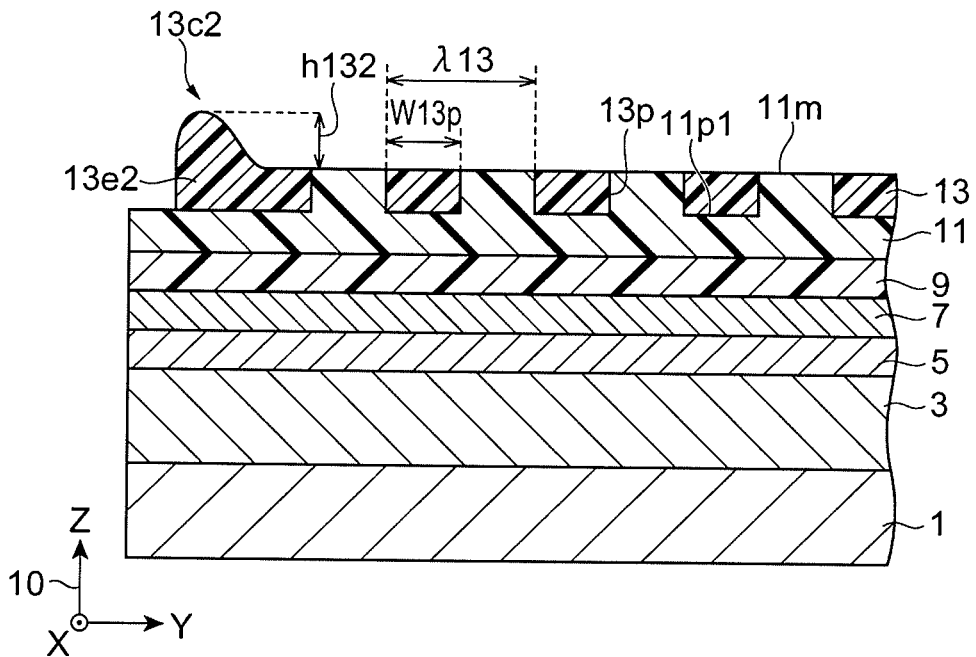

Referring to FIG. 4B, the silicon-containing resin layer 13 is then etched until a surface 11m of projections of the periodic structure pattern 11p1 of the non-silicon-containing resin layer 11 is exposed (etch-back step). The silicon-containing resin layer 13 in the etch-back step can be etched by, for example, a dry etching process such as a reactive ion etching method.

As a result, the silicon-containing resin layer 13 is made to have, in recesses of the periodic structure pattern 11p1 of the non-silicon-containing resin layer 11, a periodic structure pattern 13p corresponding to the periodic structure of the diffraction grating 7g. The periodic structure pattern 13p of the embodiment is constituted by a plurality of line sections that are periodically arranged adjacent to one another along Y axis and extend along X axis. Thus, the silicon-containing resin layer 13 masks portions of the surface of the non-silicon-containing resin layer 11.

A width W13p of the line sections of the silicon-containing resin layer 13 in the Y-axis direction is substantially equal to the width W7p of projections of the diffraction grating 7g to be formed (refer to FIG. 6B) and is, for example, 100 to 120 nm. A period λ13 of the line sections of the silicon-containing resin layer 13 is substantially equal to the period λ7 of the diffraction grating 7g to be formed (refer to FIG. 6B).

The silicon-containing resin layer 13 is preferably etched in the "step of etching silicon-containing resin layer" by an etching process in which an etch rate for the silicon-containing resin layer 13 is higher than an etch rate for the non-silicon-containing resin layer 11. The silicon-containing resin layer 13 is etched in the step of etching the silicon-containing resin layer by, for example, a reactive ion etching method employing an etching gas containing $CF_4$ gas and $O_2$ gas.

Step of Selectively Etching Non-Silicon-Containing Resin Layer

Referring to FIG. 5A, the non-silicon-containing resin layer 11 is etched through the silicon-containing resin layer 13 serving as a mask to thereby expose portions of the surface 9m of the insulation layer 9 (breakthrough etching step). When an adhesion layer is formed between the insulation layer 9 and the non-silicon-containing resin layer 11, the adhesion layer is also etched in the breakthrough etching step. The non-silicon-containing resin layer 11 in the breakthrough etching step can be etched by, for example, a dry etching process such as a reactive ion etching method.

As a result, the non-silicon-containing resin layer 11 is patterned so as to have a periodic structure pattern 11p2 corresponding to the periodic structure of the diffraction grating 7g to be formed. The periodic structure pattern 11p2 is a second pattern in the embodiment. The periodic structure pattern 11p2 is reverse to the first pattern. Specifically, the periodic structure pattern 11p2 is constituted by a plurality of line sections that are periodically arranged adjacent to one another along Y axis and extend along X axis. The width W11p of the line sections of the periodic structure pattern 11p2 in the Y-axis direction is substantially equal to the width W7p of projections of the diffraction grating 7g to be formed (refer to FIG. 6B) and is, for example, 100 to 120 nm. The period λ11 of the periodic structure pattern 11p2 is substantially equal to the period λ7 of the diffraction grating 7g to be formed (refer to FIG. 6B).

The non-silicon-containing resin layer 11 is preferably etched in the "step of selectively etching non-silicon-containing resin layer" by an etching process in which an etch rate for the non-silicon-containing resin layer 11 is higher than an etch rate for the silicon-containing resin layer 13. The non-silicon-containing resin layer 11 is etched in the second etching step by, for example, a reactive ion etching method employing an etching gas containing $O_2$ gas and $N_2$ gas. In this reactive ion etching, oxygen in the etching gas reacts with silicon in the silicon-containing resin to produce a silicon compound, for example, a silicon oxide. The presence of this silicon compound produced in the reactive ion etching decreases the etch rate for the silicon-containing resin layer 13. In contrast, the non-silicon-containing resin layer 11 is etched by the reactive ion etching employing the etching gas containing $O_2$ gas and $N_2$ gas. Thus, by increasing the proportion of $O_2$ gas in the etching gas, the etch rate for the silicon-containing resin layer 13 can be decreased while the etch rate for the non-silicon-containing resin layer 11 can be increased. In summary, by increasing the proportion of $O_2$ gas in the etching gas, the etch rate for the non-silicon-containing resin layer 11 can be made higher than the etch rate for the silicon-containing resin layer 13.

When the non-silicon-containing resin layer 11 is etched by a reactive ion etching method employing an etching gas containing $O_2$ gas and $N_2$ gas, the mixing ratio of the $O_2$ gas to the $N_2$ gas in the etching gas is preferably in the range of 1:10 to 1:2 (partial pressure ratio). When the mixing ratio of the $O_2$ gas to the $N_2$ gas is higher than 1:2, a reaction product between the $O_2$ gas and material of the silicon-containing resin may hamper etching of the non-silicon-containing resin layer 11. That is, the proportion of the $O_2$ gas in the etching gas is higher than that in the case of the mixing ratio of the $O_2$ gas to the $N_2$ gas being 1:2 (that is, the proportion of the $N_2$ gas in the etching gas is equal to or lower than that in the case of the mixing ratio of the $O_2$ gas to the $N_2$ gas being 1:2), etching of the non-silicon-containing resin layer 11 is inhibited by the reaction product between the $O_2$ gas and material of the silicon-containing resin. Accordingly, the mixing ratio of the $O_2$ gas to the $N_2$ gas is preferably equal to or lower than 1:2. When the mixing ratio of the $O_2$ gas to the $N_2$ gas is equal to or higher than 1:10, the reaction between the non-silicon-containing resin layer 11 and the $O_2$ gas sufficiently occurs and hence the non-silicon-containing resin layer 11 can be etched with a sufficient etch rate.

As illustrated in FIG. 5A, when the non-silicon-containing resin layer 11 is etched in the "step of selectively etching non-silicon-containing resin layer", the silicon-containing resin layer 13 is also etched and thinned. As a result of the "step of selectively etching non-silicon-containing resin layer", the silicon-containing resin layer 13 may be removed.

Step of Etching Insulation Layer

Figure 5:
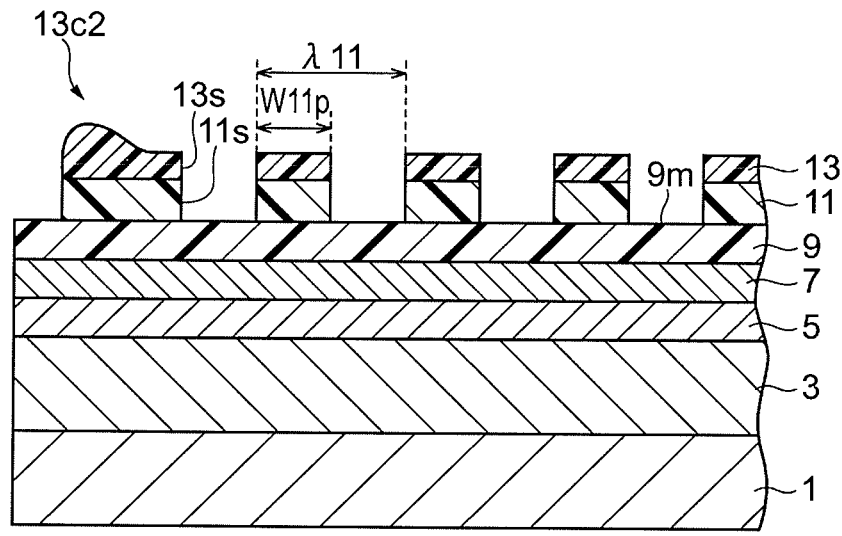
FIGS. 5A and 5B are schematic sectional views illustrating a method for producing a distributed feedback laser diode according to an embodiment.
Figure 5:
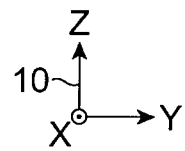
Figure 5B:
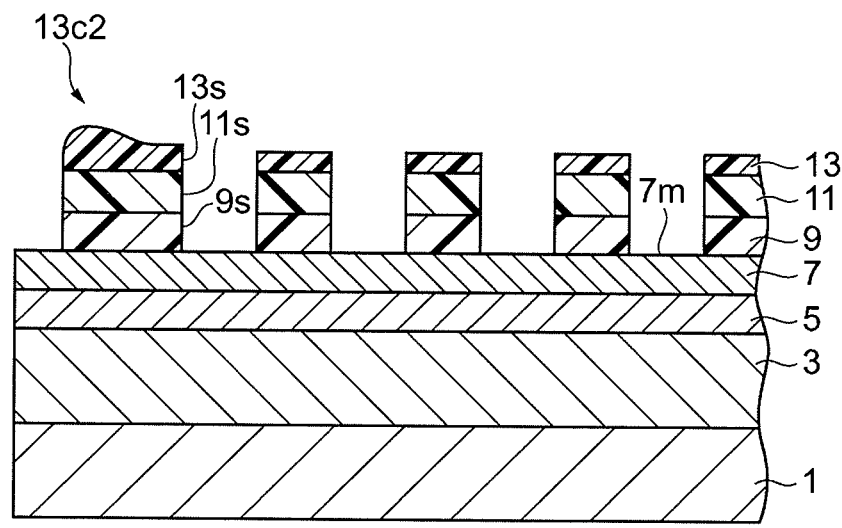
Figure 5B:
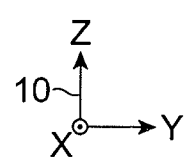

Referring to FIG. 5B, the insulation layer 9 is then etched through the patterned non-silicon-containing resin layer 11 serving as a mask (when the silicon-containing resin layer 13 remains, the non-silicon-containing resin layer 11 and the silicon-containing resin layer 13 serve as a mask). The insulation layer 9 in the step of etching the insulation layer can be etched by, for example, a dry etching process such as a reactive ion etching method. The insulation layer 9 is etched until the surface 7m of the diffraction-grating layer 7 is exposed. The embodiment will be described that includes steps of transferring the diffraction-grating pattern of the patterned non-silicon-containing resin layer 11 (when the silicon-containing resin layer 13 remains, the diffraction-grating pattern of the non-silicon-containing resin layer 11 and the silicon-containing resin layer 13) onto the insulation layer 9, and etching the semiconductor layer through the insulation layer 9 serving as a mask to thereby form the diffraction-grating pattern in the semiconductor layer. Alternatively, without the formation of the insulation layer 9, the diffraction-grating pattern may be formed in the semiconductor layer through the patterned non-silicon-containing resin layer 11 serving as a mask (when the silicon-containing resin layer 13 remains, the non-silicon-containing resin layer 11 and the silicon-containing resin layer 13 serve as a mask).

When the insulation layer 9 is formed on the semiconductor layer, contamination of the surface of the semiconductor layer can be suppressed during the formation of a micropattern with the non-silicon-containing resin layer 11 and the silicon-containing resin layer 13. In addition, the surface of the semiconductor layer can be protected from damage caused by reactive ion etching.

In the "step of etching insulation layer", the insulation layer 9 is patterned so as to have a periodic structure pattern 9p corresponding to the periodic structure of the diffraction grating 7g to be formed. Specifically, the periodic structure pattern 9p is constituted by a plurality of line sections that are periodically arranged adjacent to one another along Y axis and extend along X axis. A width W9p of the line sections of the periodic structure pattern 9p in the Y-axis direction is substantially equal to the width W7p of projections of the diffraction grating 7g to be formed (refer to FIG. 6B) and is, for example, 100 to 120 nm. A period λ9 of the periodic structure pattern 9p is substantially equal to the period λ7 of the diffraction grating 7g to be formed (refer to FIG. 6B).

The insulation layer 9 is preferably etched by an etching process in which an etch rate for the insulation layer 9 is higher than an etch rate for the non-silicon-containing resin layer 11. The insulation layer 9 can be etched by, for example, a reactive ion etching method employing an etching gas containing $CF_4$ gas.

Figure 6A:
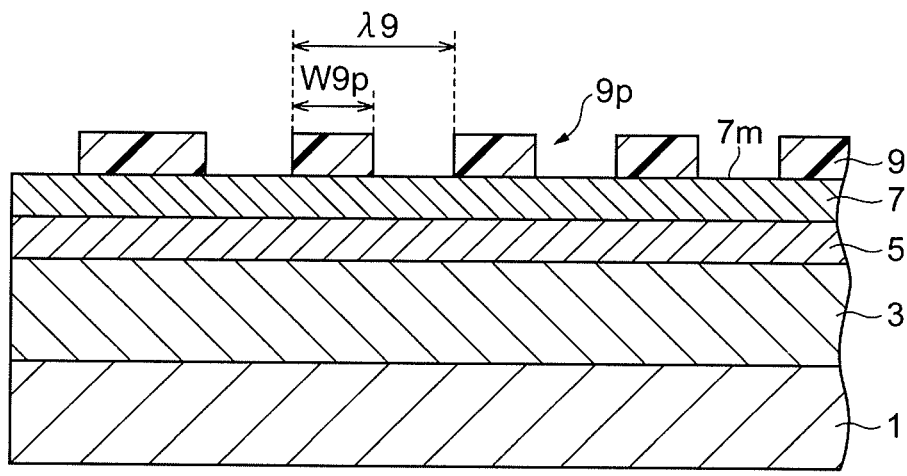
FIGS. 6A and 6B are schematic sectional views illustrating a method for producing a distributed feedback laser diode according to an embodiment.
Figure 6A:
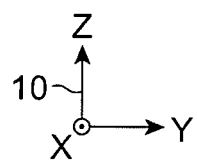

Step of Removing Silicon-Containing Resin Layer and Non-Silicon-Containing Resin Layer Referring to FIG. 6A, the non-silicon-containing resin layer 11 is subsequently removed (when the silicon-containing resin layer 13 remains, the non-silicon-containing resin layer 11 and the silicon-containing resin layer 13 are removed). The silicon-containing resin layer 13 and/or the non-silicon-containing resin layer 11 can be removed by, for example, after the "step of etching insulation layer", a dry etching process such as a reactive ion etching method. The silicon-containing resin layer 13 is etched by an etching process in which an etch rate for the silicon-containing resin layer 13 is higher than etch rates for the diffraction-grating layer 7 and the non-silicon-containing resin layer 11. The silicon-containing resin layer 13 is etched by, for example, a reactive ion etching method employing an etching gas containing $CF_4$ gas. The non-silicon-containing resin layer 11 is etched by an etching process in which an etch rate for the non-silicon-containing resin layer 11 is higher than etch rates for the diffraction-grating layer 7 and the insulation layer 9. The non-silicon-containing resin layer 11 can be etched by, for example, a reactive ion etching method employing an etching gas containing $O_2$ gas.

Semiconductor-Layer Patterning Step

Figure 6B:
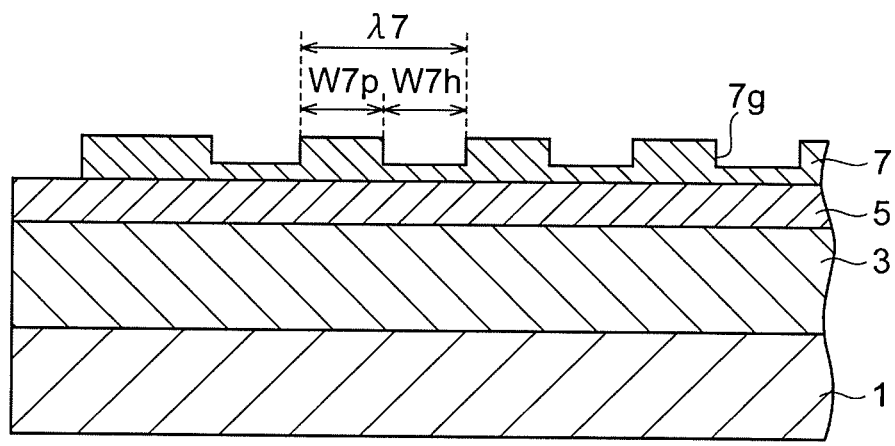
Figure 6B:
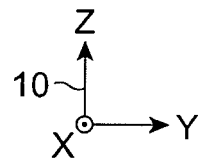

Referring to FIG. 6B, the diffraction-grating layer 7 is then etched to the midpoint of its thickness through the patterned insulation layer 9 serving as a mask and the insulation layer 9 is subsequently removed. The diffraction-grating layer 7 can be etched by, for example, a reactive ion etching method employing an etching gas containing $CH_4$ gas and $H_2$ gas. The insulation layer 9 can be removed by, for example, a wet etching process employing an etchant such as hydrofluoric acid.

As a result, the diffraction grating 7g constituted by the line-and-space pattern is formed in the diffraction-grating layer 7. Specifically, the diffraction grating 7g is constituted by line sections extending along X axis and space sections extending along X axis. The line sections and the space sections are alternately periodically disposed along Y axis. The width W7p of the line sections in the Y-axis direction is, for example, 100 to 120 nm. The period λ7 of the line-and-space pattern of the diffraction grating 7g is, for example, 200 to 240 nm.

Figure 7:
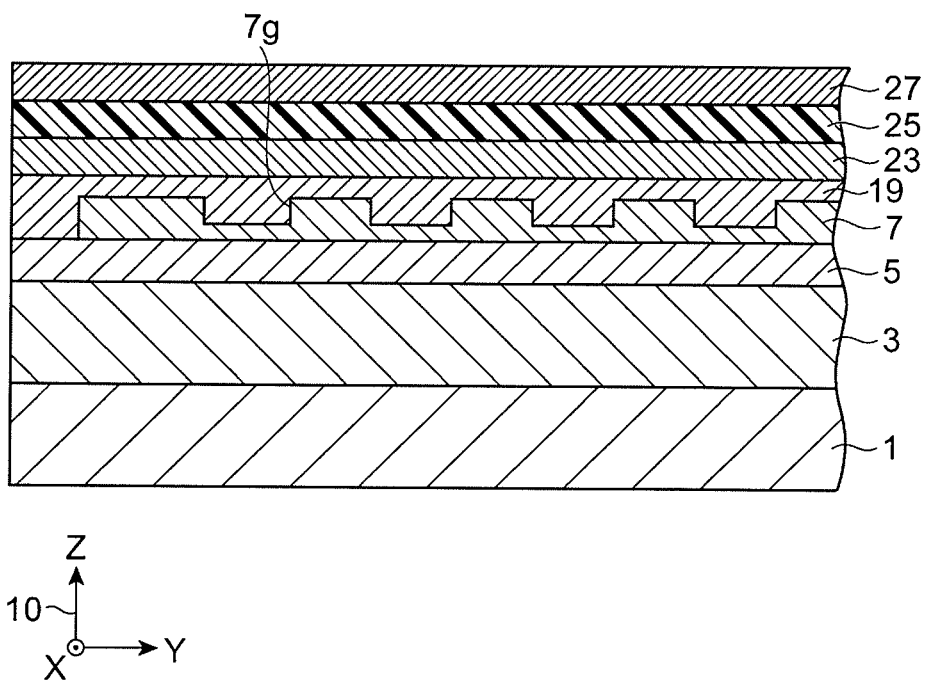
FIG. 7 is a schematic sectional view illustrating a method for producing a distributed feedback laser diode according to an embodiment.

Referring to FIG. 7, an upper cladding layer 19, a contact layer 23, an insulation layer 25, and a resist layer 27 are subsequently formed in this order on the diffraction-grating layer 7.

The upper cladding layer 19 and the contact layer 23 are formed by, for example, a metal-organic vapor phase epitaxy method. The upper cladding layer 19 is formed so as to fill and cover the diffraction grating 7g. The upper cladding layer 19 is composed of, for example, a group III-V compound semiconductor having the second conductivity, such as InP. When the second conductivity is p-type, a p-type impurity such as zinc (Zn) may be used. The contact layer 23 is composed of, for example, a group III-V compound semiconductor having the second conductivity, such as InGaAs. The insulation layer 25 is formed by, for example, a plasma CVD method. The insulation layer 25 is composed of, for example, silicon oxide ($SiO_2$) or silicon nitride (SiN). The resist layer 27 is formed on the insulation layer 25 by, for example, a spin coating method.

Figure 8A:
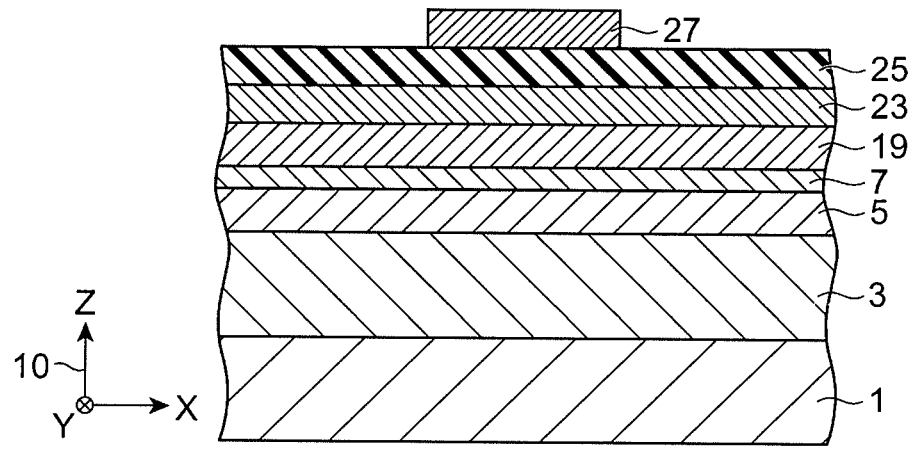
FIGS. 8A, 8B, and 8C are schematic sectional views illustrating a method for producing a distributed feedback laser diode according to an embodiment.
Figure 8B:
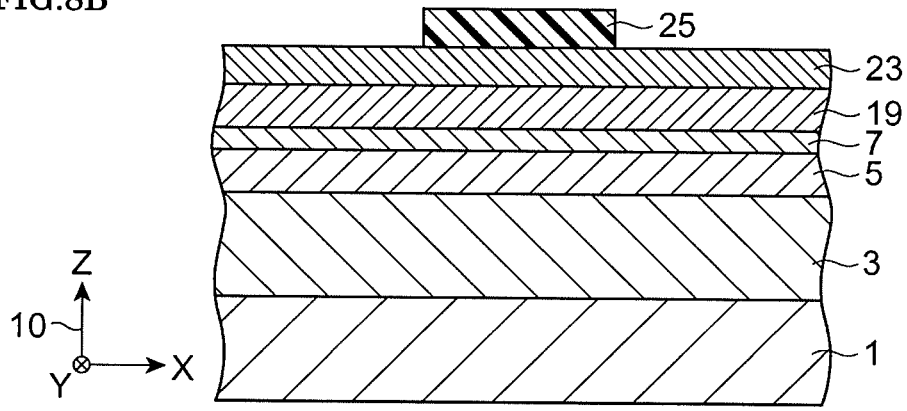

Referring to FIG. 8A, the resist layer 27 is then patterned into portions extending along Y axis by a standard photolithography process. Referring to FIG. 8B, the insulation layer 25 is then patterned into portions extending along Y axis through the patterned resist layer 27 serving as a mask and the resist layer 27 is removed.

Figure 8C:
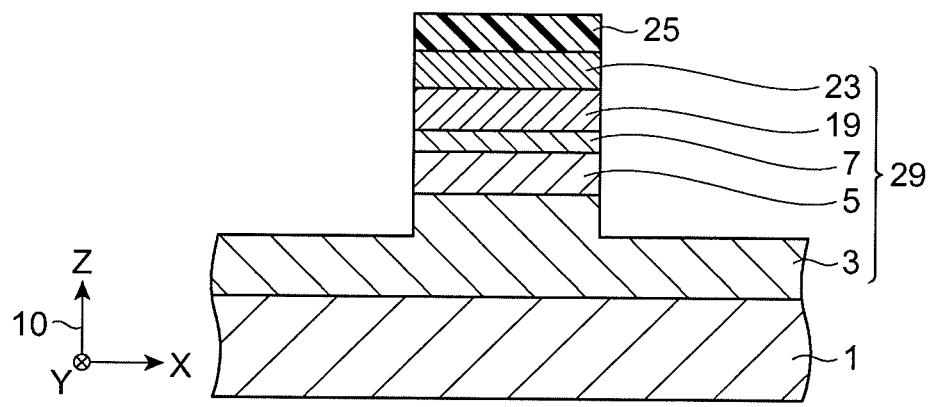

Referring to FIG. 8C, etching is then performed from the surface of the contact layer 23 to the midpoint of the thickness of the lower cladding layer 3 through the patterned insulation layer 25 serving as a mask. As a result, semiconductor mesa structures 29 are formed.

Figure 9A:
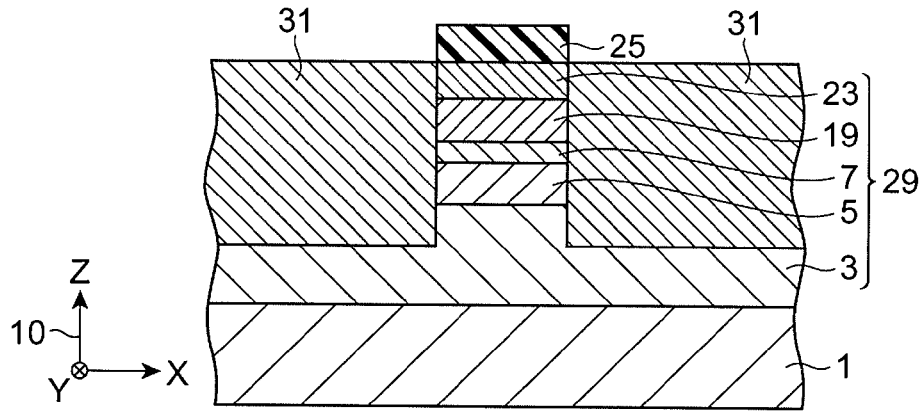
FIGS. 9A, 9B, and 9C are schematic sectional views illustrating a method for producing a distributed feedback laser diode according to an embodiment.

Referring to FIG. 9A, a group III-V compound semiconductor region 31 is then selectively grown through the patterned insulation layer 25 serving as a mask, for example, by a metal-organic vapor phase epitaxy method. As a result, the group III-V compound semiconductor region 31 is formed on the lateral sides of each semiconductor mesa structure 29 and on the lower cladding layer 3. The group III-V compound semiconductor region 31 may include, for example, an InP layer having the second conductivity and another InP layer having the first conductivity on the second-conductivity InP layer. Alternatively, the group III-V compound semiconductor region 31 may be constituted by a semi-insulating InP layer doped with Fe.

Figure 9B:
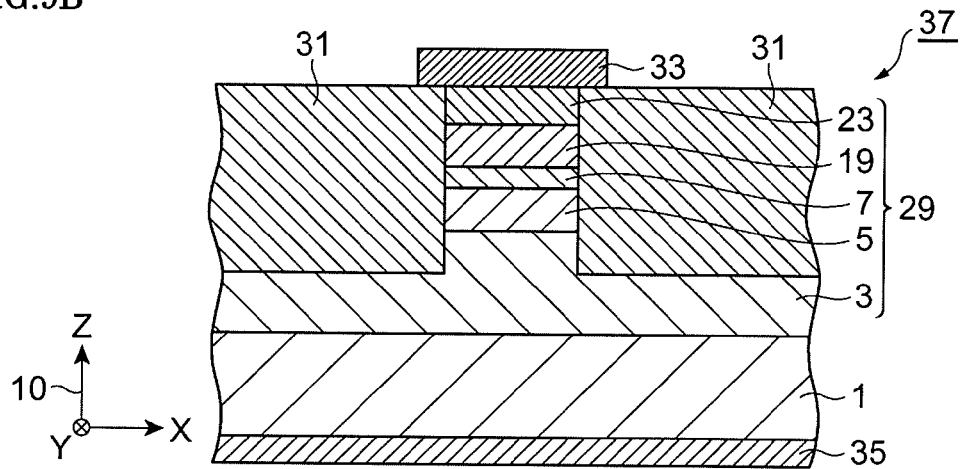

Referring to FIG. 9B, the insulation layer 25 is then removed; an upper electrode 33 is formed on the contact layer 23; and a lower electrode 35 is formed on the back surface of the semiconductor substrate 1. Thus, a substrate product 37 is formed.

Figure 9C:
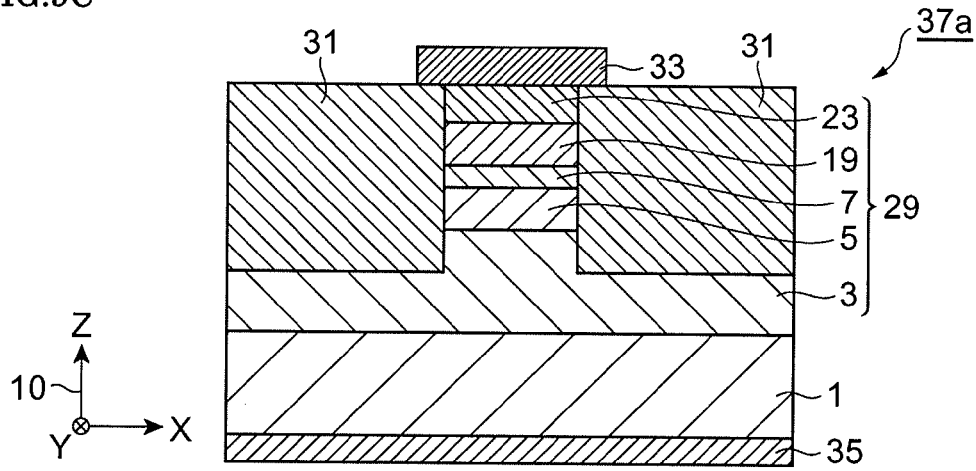

Referring to FIG. 9C, the substrate product 37 is then divided into chips to provide DFB laser diodes 37a.

By the method for producing the DFB laser diodes 37a according to the above-described embodiment, the DFB laser diodes 37a having diffraction gratings constituted by micropatterns can be produced with the laminated resin film 16 (laminated film constituted by the non-silicon-containing resin layer 11 and the silicon-containing resin layer 13, refer to FIG. 4A).

By using the laminated resin film 16, the insulation layer 9 is patterned by sequentially selectively etching the silicon-containing resin layer 13, the non-silicon-containing resin layer 11, and the insulation layer 9 by utilizing difference in the materials of the silicon-containing resin layer 13, the non-silicon-containing resin layer 11, and the insulation layer 9 (refer to FIGS. 4B to 5B). As a result, the diffraction-grating pattern formed in the non-silicon-containing resin layer 11 is accurately transferred onto the insulation layer 9. Even when a main surface of the semiconductor substrate 1 has poor planarity and, as a result, the surface of the insulation layer 9 also has poor planarity, the planarity of the semiconductor substrate 1 can be compensated for with the laminated resin film 16. As a result, the diffraction grating 7g formed in the diffraction-grating layer 7 has a uniform structure without variation due to the poor planarity of the semiconductor substrate (refer to FIG. 6B).

In the method for producing the DFB laser diodes 37a according to the above-described embodiment, after the step of applying a silicon-containing resin solution, the steps of heating the silicon-containing resin layer to a first temperature and the step applying a rinse solution are subsequently performed in the step of forming the silicon-containing resin layer 13 (refer to FIGS. 3A to 4A). In the step of heating the silicon-containing resin layer 13 to the first temperature, the viscosity of the silicon-containing resin layer 13 is increased. Due to this increase in the viscosity, when the rinse solution 14 is applied to the prominent portion 13c1 of the silicon-containing resin layer 13 (the prominent portion 13c1 being formed on the edge portion 1e of the semiconductor substrate 1) in the subsequent edge-rinse step, shift of a portion of dissolved matter of the prominent portion 13c1 toward the center of the semiconductor substrate 1 from the original position of the prominent portion 13c1 is suppressed (refer to FIGS. 3B and 4A).

As a result, the height h132 of the prominent portion 13c2 formed in the edge portion 13e2 of the silicon-containing resin layer 13 after the edge-rinse step can be made small (refer to FIG. 4A). Accordingly, in steps performed after the edge-rinse step, the occurrence of problems caused by the prominent portion 13c2 formed in the edge portion 13e2 of the silicon-containing resin layer 13 after the edge-rinse step can be suppressed. Specifically, for example, the problems are as follows: in subsequent steps, the prominent portion 13c2 comes off and becomes extraneous matter; the prominent portion 13c2 emits gas; and etching performed over a long time for removing the prominent portion 13c2 damages the crystal of any one of the layers composed of semiconductors. Since the occurrence of the problems can be suppressed, the yield in the production of the DFB laser diodes 37a can be increased.

In the method for forming the laminated resin film 16 according to the above-described embodiment, after the step of applying a silicon-containing resin solution, the steps of heating the silicon-containing resin layer to a first temperature and applying a rinse solution are performed in the step of forming silicon-containing resin layer 13 (refer to FIGS. 3A to 4A). In the step of heating the silicon-containing resin layer to a first temperature, the viscosity of the silicon-containing resin layer 13 is increased. Due to this increase in the viscosity, when the rinse solution 14 is applied to the prominent portion 13c1 of the silicon-containing resin layer 13 (the prominent portion 13c1 being formed on the edge portion 1e of the semiconductor substrate 1) in the subsequent step of applying a rinse solution (edge-rinse step), shift of a portion of dissolved matter of the prominent portion 13c1 toward the center of the semiconductor substrate 1 from the original position of the prominent portion 13c1 is suppressed (refer to FIGS. 3B and 4A).

As a result, the height h132 of the prominent portion 13c2 formed in the edge portion 13e2 of the silicon-containing resin layer 13 after the edge-rinse step can be made small (refer to FIG. 4A). Accordingly, in steps performed after the edge-rinse step, the occurrence of problems caused by the prominent portion 13c2 formed in the edge portion 13e2 of the silicon-containing resin layer 13 after the edge-rinse step can be suppressed.

The present invention is not restricted to the above-described embodiments and encompasses various modifications.

In the above-described embodiments, the diffraction grating 7g is formed in the diffraction-grating layer 7 that is beyond the active layer 5 with respect to the semiconductor substrate 1 (refer to FIG. 6B). Alternatively, the diffraction grating 7g may be formed in a semiconductor layer that is closer to the semiconductor substrate 1 than the active layer 5.

In the above-described embodiments, the method for producing the DFB laser diodes 37a having one-dimensional diffraction gratings 7g that are constituted by micropatterns by using the laminated resin film 16 is described. However, the present invention is not restricted to one-dimensional diffraction gratings and is also applicable to, for example, production of laser diodes having photonic crystals including two-dimensional diffraction gratings. The micropatterns are not restricted to diffraction-grating patterns having periodic projections and recesses and the present invention is applicable as long as a pattern includes a projection and a recess.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing a semiconductor device, comprising the steps of:
    forming a semiconductor layer on a substrate;
    forming a non-silicon-containing resin layer on the semiconductor layer;
    forming a first pattern having a projection and a recess in the non-silicon-containing resin layer;
    forming a silicon-containing resin layer on the non-silicon-containing resin layer so as to cover the projection and the recess;
    etching the silicon-containing resin layer until a surface of the projection of the non-silicon-containing resin layer is exposed, the silicon-containing resin layer being left in the recess of the non-silicon-containing resin layer;
    selectively etching the non-silicon-containing resin layer through the silicon-containing resin layer left in the recess of the non-silicon-containing resin layer, the non-silicon-containing resin layer having a second pattern reverse to the first pattern; and
    etching the semiconductor layer through the non-silicon-containing resin layer having the second pattern,
    wherein the step of forming the silicon-containing resin layer includes the steps of:
        applying a silicon-containing resin solution with a first viscosity on a surface of the non-silicon-containing resin layer to provide the silicon-containing resin layer, the silicon-containing resin solution containing a silicon-containing resin and a volatile solvent;
        heating the silicon-containing resin layer to a first temperature, the silicon-containing resin layer having a second viscosity by heating to the first temperature, the second viscosity being larger than the first viscosity; and
        applying a rinse solution containing a volatile component to an edge portion of the silicon-containing resin layer.

2. The method according to claim 1, wherein the rinse solution contains the volatile solvent of the silicon-containing resin solution.

3. The method according to claim 1, wherein, after the step of applying a rinse solution containing a volatile component to an edge portion of the silicon-containing resin layer, the step of forming the silicon-containing resin layer further includes the step of heating the silicon-containing resin layer to a second temperature, the second temperature being higher than the first temperature, and the silicon-containing resin layer being hardened by heating to the second temperature.

4. The method according to claim 1, wherein, in the step of applying a silicon-containing resin solution, silicon-containing resin solution is applied by rotating the substrate at a first rotation speed,
    in the step of applying the rinse solution, the rinse solution is supplied by rotating the substrate at a second rotation speed, and
    the second rotation speed is larger than the first rotation speed.

5. The method according to claim 1, wherein, in the step of applying the silicon-containing resin solution, the silicon-containing resin solution has a viscosity of 1.5 mPa·s or more and 2.0 mPa·s or less.

6. The method according to claim 1, wherein, in the step of heating the silicon-containing resin layer to the first temperature, the silicon-containing resin layer has a viscosity of 10 Pa·s or more and 1,000 Pa·s or less.

7. The method according to claim 1, wherein the first pattern is a diffraction grating pattern having periodic projections and recesses.

8. The method according to claim 1, further comprising the steps of:
    forming an insulation layer on the semiconductor layer after the step of forming the semiconductor layer; and
    etching the insulation layer through the non-silicon-containing resin layer to form a patterned insulation layer after the step of selectively etching the non-silicon-containing resin layer,
    wherein, in the step of selectively etching the non-silicon-containing resin layer, the non-silicon-containing resin layer is etched until a portion of a surface of the insulation layer is exposed,
    in the step of etching the insulation layer, the insulation layer is etched until a portion of a surface of the semiconductor layer is exposed, and
    in the step of etching the semiconductor layer, the semiconductor layer is etched through the patterned insulation layer.

9. A method for forming a laminated resin film, comprising the steps of:
    forming a non-silicon-containing resin layer on a main surface of a substrate;
    forming a pattern in the non-silicon-containing resin layer; and
    forming a silicon-containing resin layer on the non-silicon-containing resin layer having the pattern,
    wherein the step of forming the silicon-containing resin layer includes the steps of:
        applying a resin solution with a first viscosity on a surface of the non-silicon-containing resin layer to provide the silicon-containing resin layer, the resin solution containing a silicon-containing resin and a volatile solvent;
        heating the silicon-containing resin layer to a first temperature, the silicon-containing resin layer having a second viscosity by heating to the first temperature, the second viscosity being larger than the first viscosity;

applying a rinse solution containing a volatile component to an edge portion of the silicon-containing resin layer, and heating the silicon-containing resin layer to a second temperature, the second temperature being higher than the first temperature, the silicon-containing resin layer being hardened by heating to the second temperature.

10. The method according to claim 9, wherein, in the step of heating the silicon-containing resin layer to the first temperature, the silicon-containing resin layer has a viscosity of 10 Pa·s or more and 1,000 Pa·s or less.

* * * * *